United States Patent
Enke (10) Patent No.: US 8,937,432 B2
(45) Date of Patent: Jan. 20, 2015

(54) LIGHT SOURCE HAVING LED ARRAYS FOR DIRECT OPERATION IN ALTERNATING CURRENT NETWORK AND PRODUCTION METHOD THEREFOR

(75) Inventor: Holger Enke, Lauter (DE)

(73) Assignee: Integrated Micro-Electronics Bulgaria, Botevgrad (BG)

( * ) Notice: Subject to any disclaimer, the term of this patent is extended or adjusted under 35 U.S.C. 154(b) by 226 days.

(21) Appl. No.: 13/580,586

(22) PCT Filed: Feb. 22, 2011

(86) PCT No.: PCT/EP2011/000836
§ 371 (c)(1),
(2), (4) Date: Aug. 22, 2012

(87) PCT Pub. No.: WO2011/101172
PCT Pub. Date: Aug. 25, 2011

(65) Prior Publication Data
US 2012/0320595 A1    Dec. 20, 2012

(30) Foreign Application Priority Data
Feb. 22, 2010   (DE) .......................... 10 2010 008 876

(51) Int. Cl.
*H05B 37/00*    (2006.01)
*H05B 33/08*    (2006.01)

(52) U.S. Cl.
CPC ........... *H05B 33/0803* (2013.01); *Y02B 20/341* (2013.01); *Y02B 20/348* (2013.01)
USPC ............................ 315/192; 315/205; 315/312

(58) Field of Classification Search
USPC .......... 315/185 R, 186, 187, 192, 193, 200 R, 315/205, 246, 312; 362/294
See application file for complete search history.

(56) References Cited

U.S. PATENT DOCUMENTS

| 5,463,280 A | 10/1995 | Johnson |
| 7,501,772 B2 * | 3/2009 | Chung et al. ............... 315/185 R |

(Continued)

FOREIGN PATENT DOCUMENTS

| DE | 19918336 A1 | 11/2000 |
| DE | 20 2006 014 239 U1 | 1/2007 |

(Continued)

OTHER PUBLICATIONS

"Luxeon Rebel Assembly and Handling Information"; Application Brief AB32; Oct. 31, 2008; Retrieved from the Internet: URL:http://web.archive.org/web/20090419073612/http://www.philipslumileds.com/pdfs/AB32.pdf [retrieved on Jul. 15, 2011]; XP55002847.

(Continued)

*Primary Examiner* — Tung X Le
(74) *Attorney, Agent, or Firm* — Rankin, Hill & Clark LLP (57) ABSTRACT

To allow a direct connection of a light source to a 230V/50 Hz or 120V/60 Hz AC network and to ensure safe operation and easy adaptation to user requirements when mounting, the light source includes a series connection which is connected to a bridge rectifier (GL) and includes at least two LED arrays strands, which have several interconnected individual LEDs, and a pre-resistor, which are arranged on a plate-like, electrically contacting carrier that dissipates heat, has protection against contact and carries the at least two array-LED-strands. For direct operation in an AC voltage supply, the sum of the flow voltages of the LED arrays (U1 ... Un) is dimensioned such that it is equivalent to at least 75%, preferably 80% and a maximum of 85% of the amplitude of the rectified AC voltage at the nominal voltage, and that the array-LED-strand will be conductive if crossing the sum of flow voltages.

16 Claims, 5 Drawing Sheets

(56) References Cited

U.S. PATENT DOCUMENTS

| | | | |
|---|---|---|---|
| 8,314,564 B2 * | 11/2012 | Yu et al. | 315/185 R |
| 8,506,127 B2 * | 8/2013 | Russello et al. | 362/294 |
| 2002/0139987 A1 | 10/2002 | Collins, III et al. | |
| 2004/0206970 A1 | 10/2004 | Martin | |
| 2007/0030678 A1 | 2/2007 | Bedson et al. | |
| 2008/0200549 A1 | 8/2008 | Atkinson | |
| 2010/0039817 A1 | 2/2010 | Wen et al. | |
| 2011/0133660 A1 | 6/2011 | Tomita et al. | |
| 2012/0217885 A1 * | 8/2012 | Lee et al. | 315/192 |

FOREIGN PATENT DOCUMENTS

| | | |
|---|---|---|
| DE | 20 2006 015 692 U1 | 1/2007 |
| DE | 20 2007 008 258 U1 | 12/2007 |
| DE | 20 2008 010 709 U1 | 2/2009 |
| EP | 1 845 755 A2 | 10/2007 |
| EP | 1 930 947 A1 | 6/2008 |
| JP | 2007-12322 A | 1/2007 |
| JP | 2009-44099 A | 2/2009 |
| JP | 2010-40170 A | 2/2010 |

OTHER PUBLICATIONS

"Electric transformers for low-voltage halogen lamps"; Nov. 30, 2009; pp. 299-319; Retrieved from teh Internet: URL:http://www.tabet-engineering.com/uploads/pdf/6.Electronic_Transformers_for_low-voltage_halogen_lamps.pdf [retrieved on Nov. 23, 2011]; XP55012839.

* cited by examiner

LIGHT SOURCE HAVING LED ARRAYS FOR DIRECT OPERATION IN ALTERNATING CURRENT NETWORK AND PRODUCTION METHOD THEREFOR

The invention relates to a light source according to the preamble of claim 1. The invention further relates, according to claim 13, to a manufacturing method for the light source with the array LEDs, in particular to a method for ensuring a contact protection therefor.

Applications of light sources can be found in the field of general room illumination and in the field of street lighting. Frequently, the problem arises of accommodating the light sources in a way that it is protected as well as optimized in their effects and are arranged in a visually appealing design. For all of the abovementioned applications different, sometimes elaborate arrangements that have to be taken for to meet requirements for light sources, their housing and their installation.

From DE 199 18 336 A1, a light source of a plurality of series-connected LEDs is known. The DE 199 18 336 A1 states that typically a LED has a "voltage" of about 2 volts. In series connection for example 20 LEDs run, which is for typical applications sufficient light intensity is reached, this arrangement requires an operating voltage of the order of 40 V. This value differs significantly from the normally available mains voltage of 230 V or 110 V, so that the voltage for the LED operating either must be transformed down accordingly with a transformer or is brought to this value via a series resistor. The use of transformers for power adjustment is on the one hand costly and on the other hand due to lack of space is not always easy to be realized, whereas a larger series resistance leads to much higher losses. To provide a light source having a plurality of series-connected LEDs, which is operable at the voltage of the public AC voltage supply and which avoids the excessive power losses in the resistor, in the circuit of the LEDs and in addition to the resistor a one-speed electronic switch is arranged, which is connected to a pulse generator said pulse generator delivers pulses at a repetition frequency of at least 70 Hz. The series resistance is smaller than it would be necessary for operating at a constant current, and the arrangement is constructed so that the plurality of LEDs is operated with pulsed current, whereby the current amplitude is greater than be allowable on the LEDs operating at a constant maximum current. Preferred when operating with current pulses, the current amplitude is greater by more than a factor of 20 than the allowable maximum current during constant operation. The dimensioning rule of the pulses is chosen so short that the LED in the pulse duration is not significantly heated, and in particular that the heat dissipation off from the LED is so high that it comes not from period to period to a temperature increase in the LED. Preferably, the pulse generator and the fast electronic switch are designed so that they, together with the resistor, cause a limited current through the LEDs. In particular the rapid electronic switch can be controlled so that it operates in the manner of an adjustable resistor. The rectifier circuit may be for example a half-wave rectifier circuit or a bridge rectifier circuit, wherein it is preferably provided with a smoothing capacitor in order to provide a substantially constant current. Preferably, the electronic circuit of the pulse generator is in parallel to the circuit of the LEDs connected to the rectifier circuit. Alternatively, the electronic circuit can be operated together with a plurality of LEDs, a rapid electronic switch and a series resistor; in particular this could be done without that the rectifier circuit be connected to the voltage of the power distribution network, and without that the series resistance is much smaller than to operate at a constant power required. The described light source, i.e., the arrangement of LEDs, electrically fast switch resistor, pulse and rectifier circuit can be provided with a usual mounting base, which can be used with a usual mounting socket. This makes it possible, without changing the existing lighting structure, to replace previously used lamps, such as incandescent lamps, by the light source according to DE 199 18 336 A1. This prior art, however, doesn't teach the use of either of at least two array LEDs, and also doesn't teach without an electronic control system that the sum of the forward voltages of the Array-LEDs (U1 . . . Un) should be set so that the amplitude of the rectified AC voltage is within a certain narrow range of the nominal voltage.

Furthermore, from DE 20 2006 015 692 U1 an electronic circuit to illuminate the actuating elements of switches and buttons is known which operates directly on AC power supply, and in which one or more LEDs or a combination of diodes and LEDs via a capacitive series resistor can be directly connected to the AC power supply system. Two anti-parallel-connected LEDs are used in the actuator; thereby a small capacitor connected in series is used to limit the current. To limit the inrush current, a series resistor can be used with low power loss, the value of such, i.e., 1 k Ohm and may be greater. Should only one LED light during both half-cycles of the AC voltage, a Graetz-rectifier bridge is used, whereby the LED is connected to the DC voltage output of the Graetz-rectifier bridge could and the AC voltage input of the Graetz-rectifier bridge is directly connected via a capacitive series resistance to the AC voltage supply. For a uniform lighting, a capacitor could be connected in parallel to the LED.

Furthermore, from DE 20 2008 0107 09 U1 an LED bulb for slot machines is known, wherein in a normal market T10 socket, a BA9S socket or a BA15s socket a miniature AC bridge rectifier, connected to the AC voltage supply is installed in the lamp socket and an LED with resistor is connected to the bridge rectifier, wherein the components are sealed in the lamp socket.

Furthermore, from DE 20 2006 014 239 U1 for the operation of reflector lamps or halogen lamps with dichroic reflector a light source with at least one LED chip and a commercial socket is known, wherein the light source comprises a carrier for at least one LED chip and said carrier (e.g. SMD package) for the LED ('s) is mounted opposite to the reflector. Furthermore, said light source comprises a series resistor, one of the socket types E10, P13, 5S, BA9S, T5, T10, E5, 5, GU10, GX 5.3, G 5.3; GU4; GY 6.35, G4, a glass or a plastic body in ball or olive form to guard the LED ('s) and possibly a rectifier.

Finally, from DE 20 2007 008 258 U1 an LED-bulb is known that is sized to replace conventional incandescent bulbs. The LED-light source has a socket, a central portion connected to the control electronics, at least one printed circuit board with LEDs (light emitting diodes), a glass bulb, and side plates. The central region consists of the entire electronic control unit for the LEDs, and is preferably encapsulated in housing in order to protect the electronics from the influences of the external environment. Furthermore, in the sleeve or tube a supply switching power supply, or an AC/DC converter or a DC/DC converter is arranged, according to the purpose for which power supply the LED light source is designated, and how the LEDs are to be supplied or controlled. A LED driver module powered by the AC/DC converter by generated DC voltage is adapted to control or regulate the total current for the LEDs. This constant current source for operation of the preferably connected in series LEDs can in particular consist of transistors, diodes and resistors. Alternatively, multiple LED branches are provided, whereby preferably different constant current sources control or supply the different branches. The LEDs are arranged in a chip-on-board, or flip-chip technology in the LED module, wherein a chip-on-board module of this is preferably made of ceramic, metal or FR4 (epoxy resin+glass fiber fabric) with metal vias is such that an optimum thermal conductivity can be achieved. The LED module itself is arranged on a plate with good thermal conductivity. A high thermal conductivity and therefore a rapid heat transfer can be achieved with copper or aluminum, so that the plate is preferably made of one of these metals. According to another embodiment, a plurality of LED modules, ie, a plurality of LED branches is disposed adjacent to the plate, wherein an insulating layer which is thermally conductive, for security separates the LED module from the plate. The LEDs or the LED module are mounted on the plate in a known manner, preferably to either glued or screwed, to achieve a good thermal connection. In addition to the plate shape for the carrier further forms of support are conceivable, e.g. tetrahedral or other polyhedral shapes, and for the LED module it is also possible to be arranged not directly on the plate or on the insulation layer but to be fixed but with a certain distance from the plate on a carrier. The tube or sleeve and the plate are held and connected together by pressing, screwing or soldering, so that the heat generated by the control electronics thus can be passed over the connection to the plate. For example by means of a thermally conductive glue a domed glass bulb is mounted on the plate, which is formed as a transparent protective layer for the LEDs, and possibly also as a light collection element in order to increase the light intensity. To enlarge the heat dissipation surface of the tube and the plate are formed on the external surface of the tube cooling fins or cooling ribs (grid).

The preceding appreciation of prior-art shows, that different LED lamps also those with a series connection of individual LEDs are known. As a rule, a special electronic ballast or a driver electronics (power LED drivers and power transformation) are provided. Therefore, in practice, such LED bulbs lacks, which can be operated at low voltage without a DC current control and which independent of other technical conditions can be universally used and what is in a simple way extendable/convertible. Particularly significant is that because the lamp manufacturing industry is regarded as a progressive, high-developed industry which takes up improvements and simplifications fast and puts into practice.

Compared with the known LED lighting it is one object of this invention further to develop these so that without a special electronic ballast or a driver electronics (power LED drivers and power transformation) a direct connection to the 230V/50 Hz and 120 V/60 Hz AC power, a safe operation and an easy adaptation to the user-side requirements in building a light source is enabled. Furthermore, another object of this invention is to provide an inexpensive method of manufacturing the light source, particularly to provide a method for ensuring a contact protection of such loss.

This object is solved, according to claim 1, by a bridge rectifier and a series connection of at least two array LEDs, which have a plurality of interconnected individual LEDs, and of a series resistor, which are arranged on a plate-like, electrically contacted, heat dissipating and contact protection carrier supporting at least the array LEDs, and that for direct operation on said AC voltage network, the sum of the forward voltages of the array LEDs is dimensioned so that said is equivalent to at least 75%, preferably 80% and a maximum of 85% of the amplitude of the rectified AC voltage at the nominal voltage, and that the array-LED-strand will be conductive if crossing the sum of flow voltages.

By this very simple series circuit with one series resistor and a rectifier bridge, the reliability (lifetime) of the entire LED system (Array-LED strand) can be improved significantly. The lifetime depends from, in essence, virtually only by the light sources (power LED's) and their operating conditions (flow, temperature, stress . . . ), but not more from the additional components of usually very inexpensive and therefore usually much worse ballast. In particular by the design of the carrier with respect to heat dissipation and protection against contact the operation conditions are substantially improved. With only one or possibly more resistors, a very simple current limiting, with no additional smoothing or current regulation could be applied. Since the Array-LED strand is only conductive when the total forward voltage is crossing the current in the LED-Array strand is not continuous flowing as in DC operation. It results for the case of a 50 Hz mains voltage in a 100 Hz or for the case of a 60 Hz, in a 120 Hz pulse-forming power in the Array-LED strand, which controls these to glow.

This AC-induced pulse mode allows for a given dimension is a very good luminous efficiency at about the same energy input as in DC mode. Since the LED's used for the shorter duration of current flow in the pulse mode (AC mode) are driven with a higher current than the continuous DC mode, they can be perceived as an apparently brighter as at the same energy consumption. Simultaneously, whose forward voltage is increased by the higher current, whereby the light output ratio increases additionally because at the same time the voltage across the resistor and the duration of current flow, and thus the power dissipation is reduced.

Since the utility generally guarantees fixed tolerance limits for overvoltage and undervoltage for their mains voltage supplied with only one resistor with a low resistance value (almost equal to zero) a reliable dimensioning of the phase current for the/the Array-LED light source can be achieved. According to the invention the light source is suitable for different applications and can for example be mounted in a simple manner at appropriate locations. Especially through the integration of the carrier (heatsink/PCB board) lamp function as part of the support can be individually adapted (customized) to respect requirements to dissipate heat/thermal management. The carrier/heat sink is therefore functional component of the light (carrier, holder, mounting element, . . . ), realizes the required heat dissipation, is inexpensive to produce and could be assembled with little effort.

Furthermore this object is solved by a method for manufacturing a light source according to claim 13 wherein the light source is built up by modules of Array—LED-strands, the respective Array-LED-strand having a series circuit comprising at least two array LEDs with a plurality of interconnected single LEDs, and that for ensuring a protection against shock hazards and a protection against moisture and dirt, an LED-module-board of the Array-LED-strand is isolated in a partially transparent, two-step manufacturing process wherein Initially with the aid of a tool and by means of a low-pressure injection molding method a non-transparent coating of non-luminous components is affected, At the same time on the carrier board a wall/rib and along the contour of the mounting holes is generated, which then forms the actual "casting mold" for the second process step and In said second process step by transparent sealing compound or silicone a light-permeable, electrically and climatically insulating protective layer will be generated, wherein the encapsulation process is carried out in the gravity, and can harden both at room temperature or accelerated cure under UV irradiation The inventive manufacturing process allows the modular design of both the performance of the user-side requirements, including ensuring a protection against contact at the top of the carrier board, protection against moisture and dirt on the LED module board and the fulfillment of thermal operating conditions (due to heat dissipation to the underside of the support board), as well—despite the versatility and suitability for various applications—an inexpensive production.

In the preferred embodiment of the invention, in accordance with patent claim 2, the carrier on its upper and lower sides having metallic surfaces reaching each over its entire extent and which are suitable for making electrical contact and which are by means of a corresponding layer electrically separated from each other but connected to one another mechanically.

This embodiment according to claim 2 has the advantage of securing the necessary thermal operating conditions of the Array-LED's in the Array-LED strand by performing a generously dimensioned cooling of the (respective) Array LED mounting board. It is advantageous shown to have the realization of the lamp circuit on an aluminum core printing board or an aluminum-ceramic circuit board. To ensure Array-LED manufacturer's recommended operating temperature, preferably the cooling of the carrier board is done by thermally conductive mounting with appropriately sized heat sinks or directly on a heat dissipating metal lamp housing.

In a preferred embodiment of the invention, according to claim 3, the array LEDs is designed as a matrix circuit with individual LEDs in mixed or configurable series and parallel connection.

This embodiment of the invention has the advantages that due to the matrix circuit, a different interconnection of Array-LEDs from 2×2, 3×3 or 4×4 LEDs is enabled. Based on the novel concept of self-regulation it may, in addition to the above Array-LEDs, never be a larger current in the LED strand as the flow voltage/current characteristic defined and as is given by the "constant" voltage, and as part of the invention also any single LED (which is electrically connected to the Array-LED's) could be used, regarding their arrangement on a carrier board can be placed freely, resulting in more constructive solutions to the lighting design (large-scale distributions letter patterns to very intricate linear devices such as imitation of filament for design lighting . . . ).

Other benefits include simplified board layout, reduced assembly costs and also provides excellent color quality (CRI color rendering index) and accurate binning, since by arrangements of multiple chips (single LED or Array-LEDs) on a ceramic substrate, the tolerances of color and brightness of single chips are quasi averaged. Furthermore is ensured by the lower energy density at the same time more uniform energy distribution on the Array-LED's, this is the most substantial basis for a higher LED-lifetime and thus more robust components. In addition, the use of the color changes to white LEDs phosphorus provides the inventive arrangement of the array of LEDs a higher luminous efficacy (1 m/W) compared with single LED's, since a larger area of this phosphor is excited by the photons of the underlying mostly blue LED. The inventive light source with Array-LEDs in the LED strand can also realize the requirement for bright, energy-efficient components, which constitute at the same time extensively, distributed luminance compared to classical fluorescent tubes, thus realize a pleasant, mostly glare light source.

Further advantages and details can be taken from the following description of preferred embodiments of the invention with reference to the drawings. In the drawing.

Figure 1:
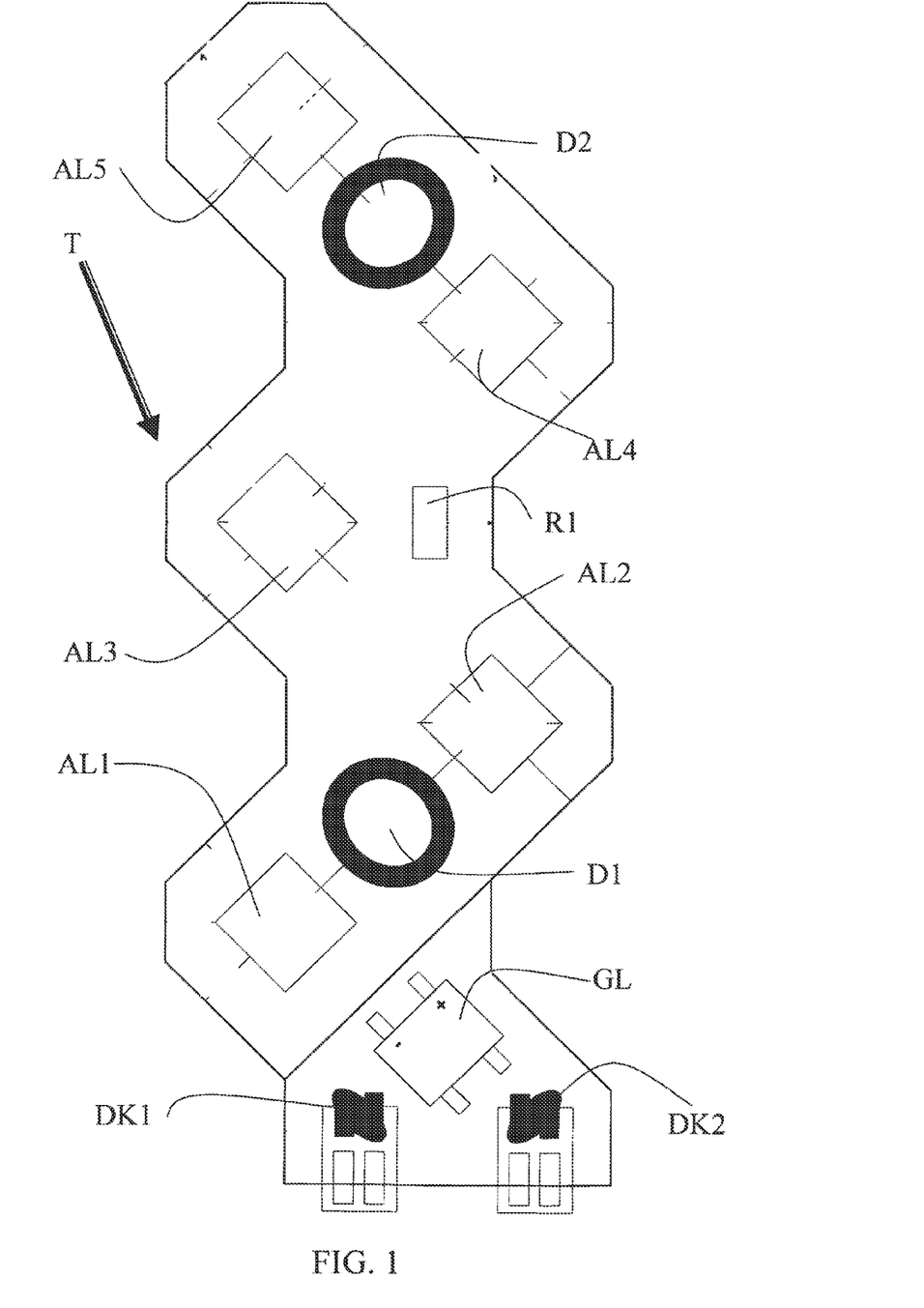
FIG. 1 shows the construction of a strand of five 16-fold Array-LEDs.

In FIG. 1 presented construction of a strand is the basis for an extremely costly and energy-efficient power LED lamps for direct connection to the AC voltage supply. The strand shown in FIG. 1 is characterized by a bridge rectifier GL, a series circuit composed of five Array-LEDs AL1, . . . , AL5 with 16 LED's and a series resistor R1, which are arranged on a plate-like, at least the Array-LEDs AL1, AL5 supporting and electrically contacting carrier T. For direct operation on AC mains below the dimensioning of an LED strand/LED quantity, the sum of the forward voltage and series resistor is described with an example. It was a strand of 5 pieces of 16-fold Array LED AL1, . . . , AL5 realized replaced (see table below), and thus 80 individual LEDs.

|  | undervoltage | | |
|---|---|---|---|
| U AC [V] | 200.0 | 210.0 | 220.0 |
| U AC Peak [V] | 282.8 | 297.0 | 311.1 |
| Upeak after rectifier [V] | 281.4 | 295.6 | 309.7 |
| UF-LED@40 mA[V] | 3.375 | 3.375 | 3.375 |
| Number of LEDs in the strand | 80 | 80 | 80 |
| Total UF [V] | 270.00 | 270.00 | 270.00 |
| n percent UF of U DC Peak | 95.46 | 90.91 | 86.78 |

|  | nominal voltage | | Overvoltage |
|---|---|---|---|
| U AC [V] | 230.0 | 240.0 | 250.0 |
| U AC Peak [V] | 325.3 | 339.4 | 353.6 |
| Upeak after rectifier [V] | 323.9 | 338.0 | 352.2 |
| UF-LED@40 mA[V] | 3.375 | 3.376 | 3.375 |
| Number of LEDs in the strand | 80 | 80 | 80 |
| Total UF [V] | 270.00 | 270.00 | 270.00 |
| n percent UF of U DC Peak | 83.01 | 79.55 | 76.37 |

The number of LED's in the strand (series connection of five Array-LEDs AL1, . . . , AL5 with 16 LED's=80 LED's) is preferably selected so that the sum of the individual forward voltages corresponds approximately 80% of the voltage amplitude of the rectified AC voltage. Particularly by dimensioning of the series resistor R for current limitation, the operating point of the series circuit are set so that the converted electrical power in the strand at rated voltage (for example 230V) corresponds to about 80-85% of the sum of the individual ratings of the LED's in the line-connected.

According to the invention the sum of the forward voltages of all in the strand located LEDs is selected as high as possible, so that these corresponding to at least 75%, better than 80% and a maximum of 85% of the amplitude of the rectified AC voltage at the nominal voltage. It is thereby achieved that at nominal voltage in the series resistor R only a relatively low power is implemented. This is favored by the magnitude of the forward voltage, which is a function of the phase current. This means, the larger the sum of the forward voltages (preferably 80% of the amplitude of the rectified voltage), the shorter is the current flow duration in the strand. Thereby to implement the same power in the line, this requires a higher pulse current amplitude, which reduces the power dissipation in the series resistor R, as with more current at the same time more voltage across the array more LEDs ALI, . . . , AL5 is present.

Furthermore, the nominal value of the resistance R in the LED strand/string/cluster with the Array-LEDs AL1, . . . , AL5 is dimensioned so that in the strand the converted electric power at rated/nominal voltage is only about 80-85% of the sum of the individual ratings of the LEDs used. In this way, even with over-voltage, safe operation is ensured.

In particular in the above example the bulb circuit comprises a series resistor R1 (50 Ohm), a bridge rectifier GL (1 A/600V) and 5 pieces of Array-LEDs AL1, . . . , AL5. Directly operated on 230V AC power consumption is approximately 9 watts whereby the power dissipated in the resistor R is about only 0.2 watts. The circuit described is the basic circuit (basic version) of an LED string for 230V AC. Larger systems according to the invention could be simply realized by parallel connection of a plurality of such strands (for example, serial connection of five Array-LEDs AL1, . . . , AL5 with 16 LED's=80 LED's in the LED cluster, see FIG. 4).

A similar system according to the invention can be realized with other Array-LED AL1, . . . , AL5 different array size when the internal single LED's are connected in series and the inventive dimension rule is used.

Securing the necessary thermal operation condition in the prior art the single LED's is made by a generously dimensioned cooling of the LED mounting board, as described for example in the aforementioned DE 20 2007 008 258 U1. In the present invention due to the use of a carrier T which is in the main extension direction configured as a meander or sawtooth wave shape and on which the five Array-LEDs AL1, . . . , AL5 are arranged in the same distance from one another and follow the profile on the one hand, the manufacturer's recommendations with respect to the electrical and thermal operating conditions of the used power LEDs could be fulfilled and on the other hand, by increasing the series resistor R, the power converted by the five Array-LEDs AL1, . . . , AL5 with for example 16 LEDs=80 LED's could be targeted reduced, thus a lower operating temperature and thus significantly longer service life time and system efficiency for the LED light source can be achieved. In the present invention as advantageous realization is the realization of the lamp circuit on an aluminum core printing board or an aluminum-ceramic circuit board. To ensure Array-LED manufacturer's recommended operating temperature, preferably the cooling of the carrier board is done by thermally conductive mounting with appropriately sized heat sinks or directly on a heat dissipating metal lamp housing.

As part of the inventive concept also a series resistor R could be used with a resistance value of approximately 0Ω (or can be entirely omitted, see FIG. 4 lower three LED strand/strings LS1, LS2, LS3), if the tolerances of the forward voltage of the respective LED's in each array LED AL1, . . . are negligible or, for example, the chosen number of LED's is greater than the calculated value. The enlargement of the series resistor R resulting in a slightly lower light output is negligible due to the much lower system cost (no ballast) and the resource savings. Even for cost-sensitive applications can be adapted, if necessary, the operating temperature of the heat radiation of any light carrier, which also acts as a cooling surface, whereby according to the inventive concept, the power dissipation of the installed LED module is deliberately so much reduced that the heat dissipated by the lamp housing and their housing surface heat radiation to the environment is adapted. In connection with additional cooling by heat sinks which are accommodated in the lamp by the dome D1, D2 and which are used per se for attaching these to the carrier board, said dome D1, D2 also act as heat sinks and thus support the heat dissipation from Array-LED module to the heat sink and then to the outer shell of the lamp housing.

For direct operation on 120V/60 Hz-Netz below another example of a lamp with an appropriate LED strand of Array-LEDs ALI1, AL2 will be described.

|  | undervoltage | | |
|---|---|---|---|
| U AC [V] | 102.0 | 110.0 | 115.0 |
| U AC Peak [V] | 144.2 | 155.6 | 162.6 |
| Upeak after rectifier [V] | 142.8 | 154.2 | 161.2 |
| UF-LED@40 mA[V] | 3.375 | 3.375 | 3.375 |
| Number of LEDs in the strand | 42 | 42 | 42 |
| Total UF [V] | 141.75 | 141.76 | 141.76 |
| n percent UF of U DC Peak | 98.27 | 91.12 | 87.16 |

|  | nominal voltage | | Overvoltage |
|---|---|---|---|
| U AC [V] | 120.0 | 125.0 | 132.0 |
| U AC Peak [V] | 169.7 | 176.8 | 186.7 |
| Upeak after rectifier [V] | 168.3 | 175.,4 | 185.3 |
| UF-LED@40 mA[V] | 3.4 | 3.375 | 3.375 |
| Number of LEDs in the strand | 42 | 42 | 42 |
| Total UF [V] | 142.80 | 141.75 | 141.75 |
| n percent UF of U DC Peak | 84.15 | 80.19 | 75.93 |

As is apparent from the table above, with approximately 42 LED's be combined a similar circuit for 120V could be realized. According to the present invention the number of LED's can be varied to the calculated result (according to the data sheets determined) to obtain a suitable image in the inventive modular design with available Array-LEDs. When using 9er Array-LEDs according to the present invention 4 (see FIG. 4 LED strands LS4) or 5 of these LED's (4×9=36 and 5×9=45) were used. Furthermore, according to the present invention different array sizes of 4er, 6er, 8er, 9er, 12er, 16er, etc. could be combined, provided that the single chip used in the Array LED's or in the LED strand/string/cluster used Array-LEDs have the same operating parameters with respect to current and forward voltage. Thereby, the sum of the forward voltages are adjusted to the calculated optimum accuracy.

Accordingly, in the Array-LED string Array-LEDs AL1, AL2, . . . with same or different array sizes of at least two single LEDs, preferably 4er, 6er, 8er, 9er, 12er, 16er array size (the single LEDs are connected as a pure serial circuit or a mixed serial-parallel circuit), can be arranged. If, for example for the above realization 6erArray LEDs (6 pieces in a row) are used the calculated 42 LED's could be 1:1 mapped with 7 pieces, giving it also a cost-optimal solution due the modular construction.

To protect against environmental influences and to protect the user/user preferably a coating of the carrier T with protective coating is provided for example by casting. In particular, the connection terminals are in the form of double terminals DK1, DK2 (for a reverse polarity, the double terminal DK1 for 220 V and the double terminal DK2 is 0 V are used, for example, see FIG. 1), each having on one side a cover and on the other side two locking clamps for the connecting wires of the mains voltage. In a surprisingly simple manner, the spatially shaped carrier T (in which the surfaces to be coated must pass over the assembled components, that is for example, only the rear connector to be coated and to keep the front-side plug contacts free of coating, this means using a double terminal DK1, DK2 without cover (3rd dimension)) could be coated by wetting and use of capillary pressure (for example, a capillary of 1 µm diameter produces a suction pressure of 2.8 bar, corresponding to a height of 28 meters with wetting water) or could be coated by the adhesive (i.e., the force that acts between the two fluids, which, for example, the liquid rises at the wall of the component located on the printed circuit board).

The problem of the maximum clamping voltage, for example 160V DC by using a highly compact terminal was solved according to the inventive concept in that the two-terminal potentials of the line voltage to be fed to the double terminal DK1, DK2 having in each case the same potential, and these are spatially separated from each other on the carrier board T. As the voltage difference between the clamp terminals of a double terminal DK1, DK2 practically is 0 volts at the same time a simple way was created to pass the supply voltage applied to the first terminal as needed by a parallel connection to other LED modules.

Figure 2:
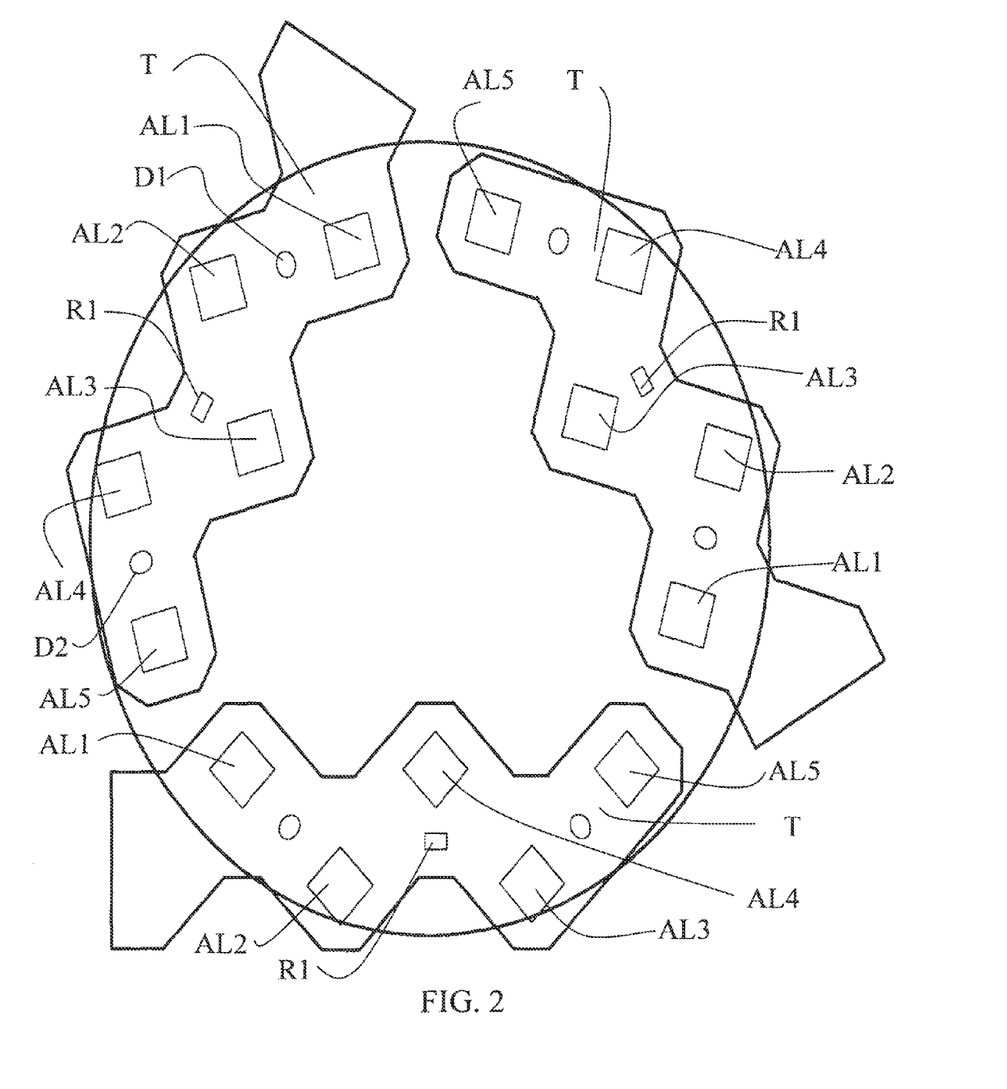
FIG. 2 shows the structure of a ring of three strands of FIG. 1.
Figure 3:
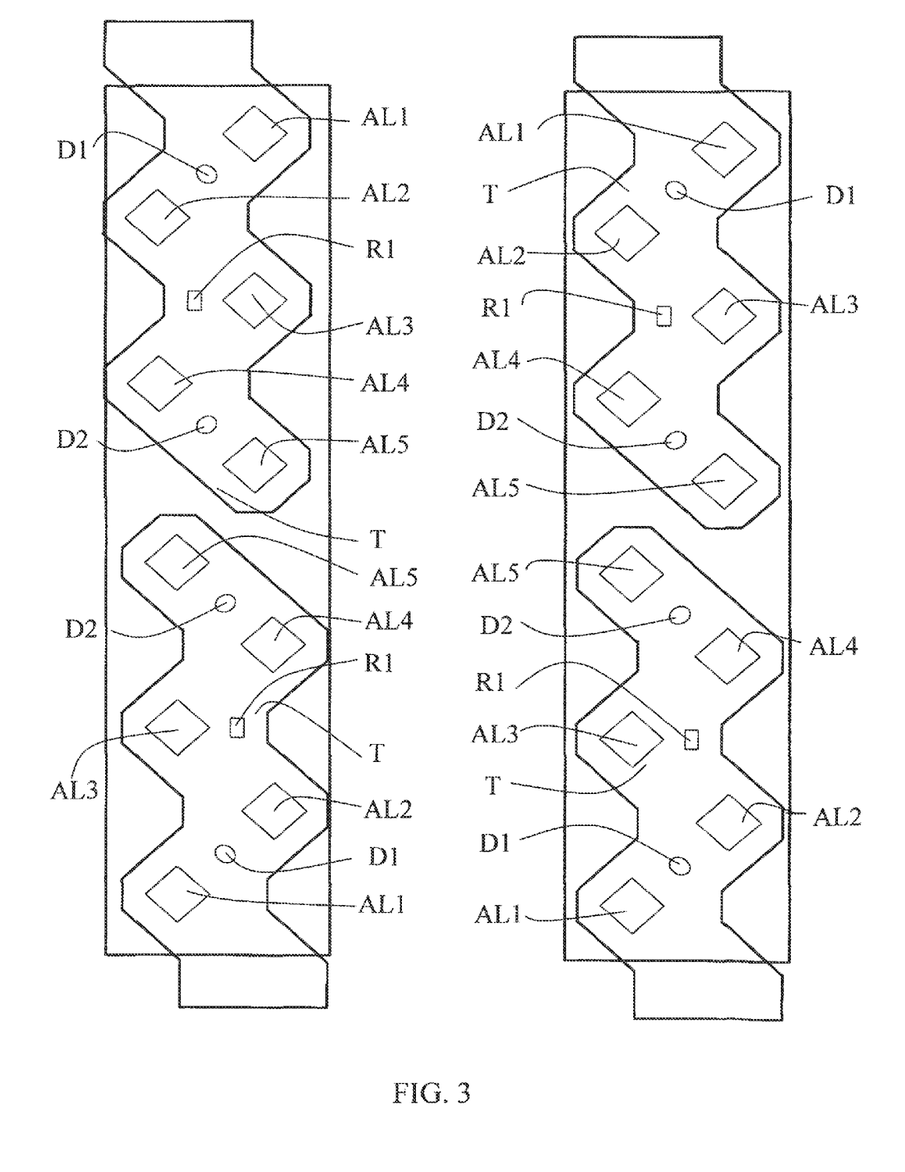
FIG. 3 shows the structure of a double rod of four strands of FIG. 1.
Figure 4:
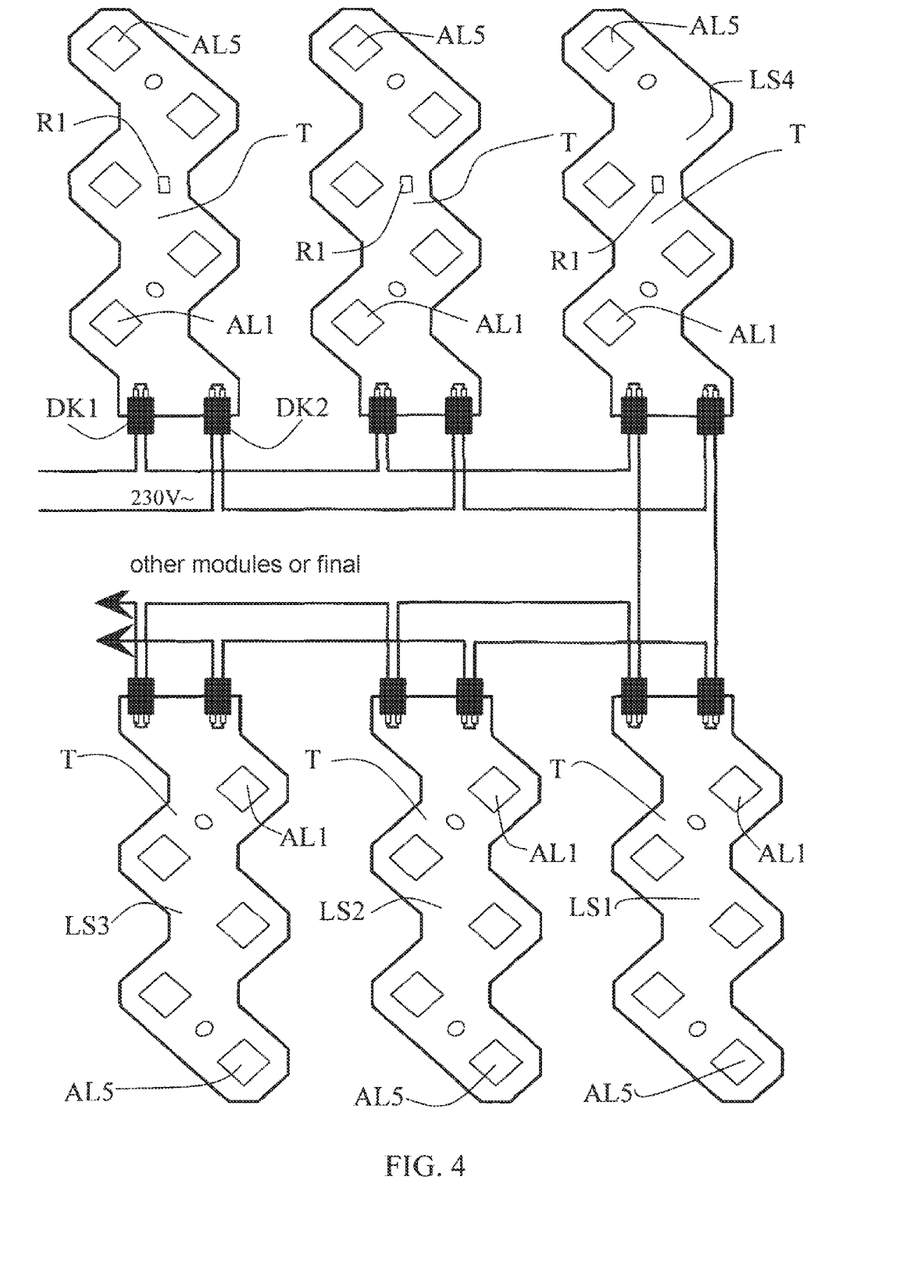
FIG. 4 shows the wiring diagram on the basis of double terminals.
Figure 5:
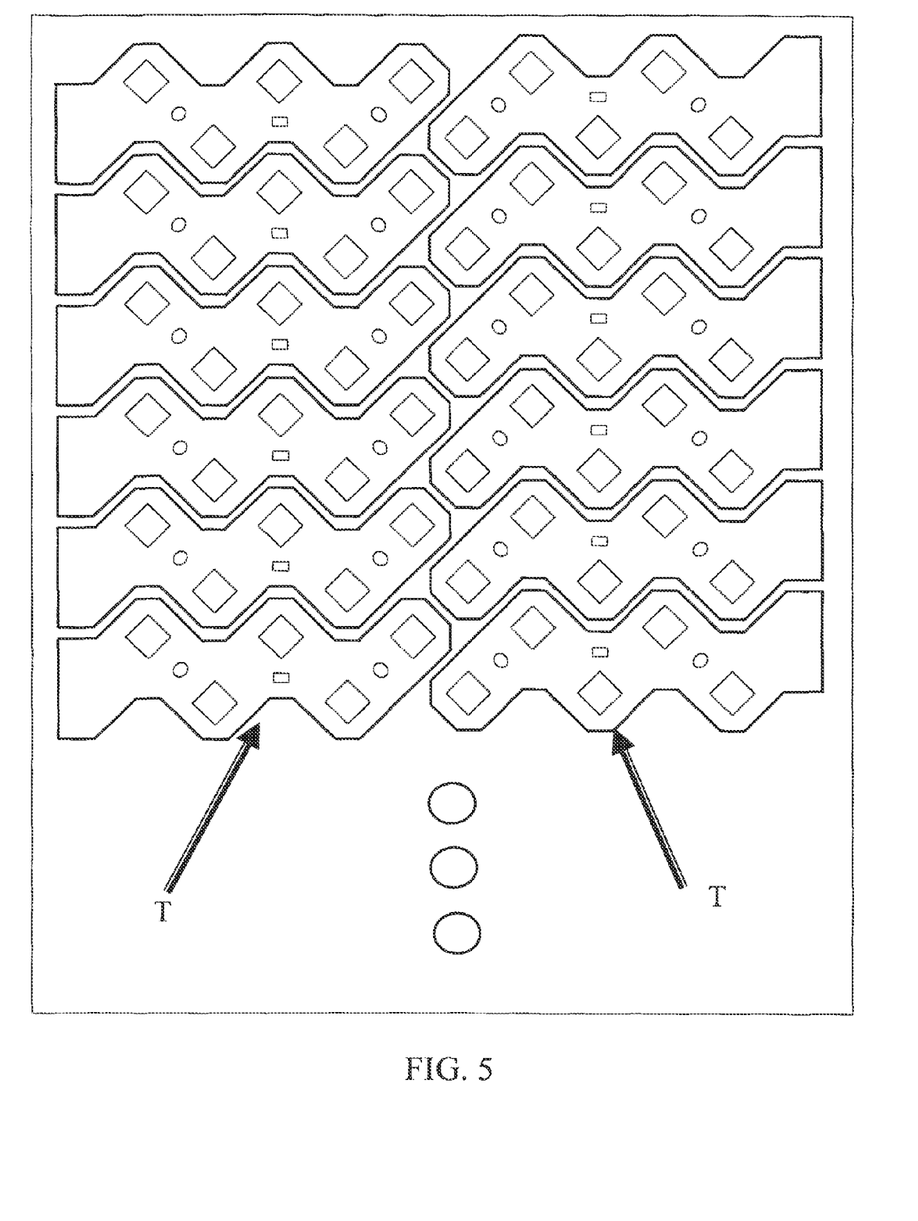
FIG. 5 shows the circuit board panel from strands of FIG. 1.

FIG. 2 shows the construction of a circular lamp, in particular a ring of three strands of FIG. 1, FIG. 3 shows the construction of a rectangular lamp, in particular of a double rod of four strands of FIG. 1, FIG. 4 shows the wiring diagram on the basis of double terminals DK1, DK2, and in FIG. 5 the PCB panels from strands of FIG. 1 is shown. As FIG. 2 and FIG. 3 may show through the use of a carrier T, which is configured in the main extension direction as meander or sawtooth, a very good use of space, and a spatial distribution of the terminals of the mains voltage can be achieved. Furthermore, this refinement of the carrier T allows a costly production (production benefit with minimal material waste and separating with uniformly broad milled slot/punching channel) and a structural configuration of the light source according to the invention, especially considering the simple fulfillment of requirements for light brightness and temperature, including structural design of the lamp itself.

The central idea of the inventive concept, is the self-regulation in the LED strand/string/cluster AL1, AL2 is . . . with consistent use of the current/voltage characteristic of an arbitrary LED by reversing the procedure in the dimensioning of the working point of an LED circuit, namely from the current to the voltage.

Since the forward voltage of each LED is a function of its current, one can make use of the in a wide range of characteristic approximately linear relation to dimension a stable operating point, by not, under certain operating conditions, as according to prior art, providing to the component a proper current what is generally required additional components, but by dimensioning the forward voltage of an LED circuit according to nominal current so that is adjusted to the voltage supply. This is achieved in a surprising simple manner by varying the number of series-connected LEDs, achieving also a stable operating point, but without the additional components.

A bulb that is to be designed to supply voltage for the operation can thus with respect to its operating point and as opposed to a constant controlled current operated lamps now can simply refer to the substantially constant voltage as a reference by reference. Since the tolerances of the mains voltage depends from network operators guarantee you can include it as a constant in the reference system and thus requires no additional active current control, but uses the functional relationship of the U/I characteristic of the LED to the stabilization of the operating point on the basis of tolerance line voltage.

It can practically never a larger current in the LED strand AL1, AL2, . . . , as set by the flow of voltage/current characteristic defined and determined by the "constant" voltage (this means the self-regulation of the inventive concept).

This central idea of the inventive concept is the basis for the understanding of the inventive details, constructive relationships and solutions, thus providing the user with a safe dimensioning basis for the implementation of the theoretical functional relationships in practical realized lamps, with simultaneous thermal management and ensuring the insulation. For example, a ceramic circuit board for thermally coupling and isolation can be used. The ceramic circuit board is used as a component carrier, as an insulator to be received in the lamp and as a thermal coupling to the heat sink portion for heat dissipation. The electrical parts are molded complete with plastic and meet appropriate standards for insulation and creepage distances.

The manufacturing process of the inventive light source can be described as follows. The carrier board is an aluminum substrate PCB (IMS=insulated metal substrates) manufactured in a milling, punching or production frame (Ritz benefit) from a PCB manufacturer. This board is equipped like conventional printed circuit boards with SMD pads and traces. The pads will be screen printed with solder paste. The subsequent assembly of SMD components (LED, resistor, diode or rectifier and contact elements (terminals)) is with SMD pick-and-place machine and is then either reflow soldering technique or if available with a vapor phase reflow. Alternatively to the connection terminals also a cable directly can be soldered to corresponding connection pads of the circuit card/carrier T.

To maintain touch protection and to protect against moisture and dirt, the LED module board T is preferably (semi-) transparent isolated in a two-step process.

First with the help of a tool is a non-transparent encapsulation of non-luminous components using a low-pressure injection molding method (for Example based on hotmelt/melt which is injected with about 10 bars in an aluminum hollow tool).

While on the upper side of the carrier plate T an approximately 2 mm thick wall and along the contour of the mounting holes is generated, so that chambers are formed. This then forms the actual "casting mold" for the $2^{nd}$ process step. Now through transparent encapsulate (for example silicone) a for light permeable, electrically and climatically insulating protection film is generated. The compound will be in the gravity method, and can be used both at room temperature or accelerated cure under UV irradiation. In particular, the carrier board T may be formed on the underside of a metal plate, in particular aluminum plate to remove the heat from the Array-LEDs AL1 (if necessary, further individual LEDs) which is arranged on the upper side to the bottom (reduction of the heat load of the at least partially transparent, optionally with conversion dye/conversion foil provided protective layer). After this, a simple checking to secure the desired electrical and optical parameters is done.

Correspondingly, the insulation/touch protection of mains, connection cable and connector/terminal double DKL, DK2 can be done. Particular, by a recess in the Aluminum-part/lower surface of the support plate T the cable of the mains supply are guided and by subsequent casting or injection molding, the insulation is ensured, whereby the plug/double terminal DK1, DK2 is encapsulated on all sides with plastic. The cable can also be incorporated into an insulation box, which also can (usually) be poured. The connection cables are introduced from below through the circuit board and soldered onto surface of support plate T to corresponding solder pads. By subsequent casting with appropriate transparent plastic (for example, weather-resistant material, such as in solar cells), the insulation is ensured.

To connect the PCB/carrier plate T (metal aluminum, multilayer FR4 with large Cu surfaces or ceramic) with a good thermal heat sink, in the context of the invention there are the following options:

Insertion of thermal paste (like transistors) and subsequent bolting,

Special ceramic films—screwing,

Special ceramic films—adhesive (simple fast installation is possible),

PCB aluminum heatsink that is integrated into the heatsinks thus the heatsink is performed as a circuit board, PCB T is formed as a flexible film (FlexPrint/IMS insulated molded substrate) and at the points of the Array-LEDs AL1 . . . aluminum surfaces are integrated, these are placed below Array-LEDs AL1, . . . and thus—as described above—can be mounted with thermal paste or thermal conductive foil on the actual heatsink. The possibly very thin carrier T in a preferred embodiment is provided with the necessary electrical conductive structures to electrically contact the light-generating elements (Array-LEDs AL1, . . . , optionally additional single LEDs). In the case of the use of the LED chip, the electrical contact is generally carried out by a so called diebond which firstly fastened the chip on the support and, secondly, on a first electrical contact, and by a so-called wire bonding, this leads the corresponding point on the upper chip surface to a contact point of the support plate T. In other cases, there is only a means of Diebondes for fastening the chip, while the electrical connection is done with two wire bonds.

In cases in which the inventive light source is equipped of LED modules AL1, . . . with a large number of light-generating elements, for example with 16 or 25 LED chip per cm2, it is essential that the thin carrier T derives as well as possible heat. In these cases it is of advantage to build up the carrier T so that it comprises a metal support film or plate, which has a thin, electrically insulating layer, that is for example, a number of 10 μm thick layer of plastic, better but a 0.5 bis 1 μm thin silicon oxide layer or silicon nitride layer or a correspondingly thin glass or ceramic layer for example applied by sol-gel method. On this, possibly locally opened insulating layer there is next a structured metal layer, which—if necessary with the inclusion of the electrical contacting of the lower metal support sheet—which enables electrical contacting of the LED chip modules AL1, . . . , optionally of single LED chip. Through the flexible carrier T the lamp shape, for example a jagged configured lamp can be adapted.

The inventive light source with its modular structure allows a flexible adaptation to the individual needs of the user, especially with regard to protection against contact and heat dissipation, but yet is inexpensive to produce.

The invention is not limited to the illustrated and described embodiments, but also encloses all embodiments with the same effect in the sense of this invention. According to present invention, a circuit module, such as a bridge or a transistor (switch) should be arranged upstream of the strand of Array-LED's, so that functions such as dimming, on/off or a complete lighting management system with motion and/or brightness control or timer function are enabled. Furthermore, the invention is also not limited to the combination of features defined in claim 1, but can also be defined by any other combination of specific features of all the total disclosed individual characteristics. This means that basically every single feature of claim 1 can be left out or be replaced by at least one single feature, disclosed elsewhere in this application.

The invention claimed is:

1. A light source comprising:

an array-LED-strand comprising a series connection of at least two array LEDs, each including a plurality of interconnected individual LEDs;

a rectifier circuit as a power source for the array-LED strand, which in operation is connected to an AC voltage network, the rectifier circuit comprising a bridge rectifier; and a series resistor;

wherein the bridge rectifier, the series connection of at least two array LEDs, and the series resistor are arranged on a plate-like, electrically contacted, heat dissipating and contact protection carrier supporting at least the array LEDs, and wherein, for direct operation on said AC voltage network, the sum of the forward voltages of the array LEDs is dimensioned so that said is equivalent to at least 75% and a maximum of 85% of the amplitude of the rectified AC voltage at a nominal voltage, and wherein the array-LED-strand is only conductive when the sum of flow voltages is crossing.

2. The light source according to claim 1, wherein the carrier on its upper and lower sides has metallic surfaces extending over its entire extent, wherein the metallic surfaces are suitable for making electrical contact, and wherein by means of a corresponding layer the metallic surfaces are electrically separated from each other but connected to one another mechanically.

3. The light source according to claim 1, wherein the array LEDs are designed as a matrix circuit with individual LEDs in mixed or configurable series and parallel connection.

4. The light source according to claim 1, wherein the carrier in a main extension direction is arranged in meander or saw tooth or wavy form, and wherein the array LEDs each are arranged at the same distance and following the course of the carrier.

5. The light source according to claim 4, comprising a construction of a ring of at least three carriers with array-LED-strands arranged in a circle meander or saw-tooth or wave-shaped form or a construction of a double rod of mutually parallel carriers with array-LED-strands.

6. The light source according to claim 1, wherein a dome lying in a center line of the carrier is used for fixing the carrier and also for heat dissipation or as a heat sink.

7. The light source according to claim 1, wherein the carrier is coated with a protective lacquer.

8. The light source according to claim 1, wherein two double terminals are provided on the carrier for establishing connection to the AC voltage network, and wherein the double terminals are spatially separated from each other on the carrier.

9. The light source according to claim 1, wherein in the array-LED-strand, array LEDs are arranged with same or different array sizes of at least two individual LEDs.

10. The light source according to claim 9, wherein in the array-LED-strand, array LEDs are arranged in an array size selected from the group consisting of 4, 6, 8, 9, 12 and 16.

11. The light source according to claim 1, wherein in the event that tolerances of the forward voltages of the respective individual LEDs in the respective array LED can be neglected or the number of individual LED's is selected greater than a calculated maximum value, the series resistor has a resistance value of approximately 0Ω or is entirely omitted.

12. The light source according to claim 1, wherein the array LEDs are in the form of LED chips.

13. The light source according to claim 1, wherein the carrier is designed as multi-layer carrier, wherein for heat dissipation a lowermost layer is made of metal that is arranged to overly a populated printed circuit board, and wherein a coating is applied on top of the assembled printed board.

14. The light source according to claim 1, comprising a construction of a ring of at least three carriers with array-LED-strands arranged in a circle meander or saw-tooth or wave-shaped form or a construction of a double rod of mutually parallel carriers with array-LED-strands.

15. A method for manufacturing a light source as claimed in claim 1, wherein the light source is built up by modules of array-LED-strands, wherein each respective array-LED-strand includes a series circuit comprising at least two array LEDs with a plurality of interconnected single LEDs, and that for ensuring a protection against shock hazards and a protection against moisture and dirt, an LED-module-board of the array-LED-strands is isolated in a partially transparent, two-step manufacturing process wherein:

initially with the aid of a tool, and by means of a low-pressure injection molding method, a non-transparent coating of non-luminous components is affected, at the same time on the LED-module-board, a wall/rib and along a contour of mounting holes is generated, which then forms an actual casting mold for a second process step and in said second process step, a light-permeable, electrically and climatically insulating protective layer is generated from a transparent sealing compound or silicone, wherein the encapsulation process is carried out using the force of gravity, and hardening of the transparent sealing compound or silicone is obtained at room temperature or via accelerated cure under UV irradiation.

16. The light source according to claim 1, wherein the sum of the forward voltages of the array LEDs is dimensioned so that said is equivalent to 80% of the amplitude of the rectified AC voltage at the nominal voltage.

* * * * *